(12) United States Patent
Mills et al.

(10) Patent No.: US 8,500,462 B2
(45) Date of Patent: Aug. 6, 2013

(54) JUNCTION BOX FOR A PHOTOVOLTAIC SOLAR PANEL

(75) Inventors: Brian Wade Mills, Santa Rosa, CA (US); Robert D. Street, Morgan Hill, CA (US); Danny Cam Toan Lu, San Francisco, CA (US); Yacov Elgar, Sunnyvale, CA (US); Ian Worthington Weatherley, Santa Rosa, CA (US); Dustin Delmar Reede Carver, Windsor, CA (US); Jeffrey S. Sullivan, Castro Valley, CA (US); Ian McKay Pratt, Ukiah, CA (US)

(73) Assignees: Applied Materials, Inc., Santa Clara, CA (US); Multi-Holding AG, Allshwil (CH)

( * ) Notice: Subject to any disclaimer, the term of this patent is extended or adjusted under 35 U.S.C. 154(b) by 309 days.

(21) Appl. No.: 12/742,554

(22) PCT Filed: Oct. 30, 2008

(86) PCT No.: PCT/CH2008/000455
§ 371 (c)(1),
(2), (4) Date: Sep. 7, 2010

(87) PCT Pub. No.: WO2009/062326
PCT Pub. Date: May 22, 2009

(65) Prior Publication Data
US 2012/0060919 A1   Mar. 15, 2012

Related U.S. Application Data

(60) Provisional application No. 60/987,229, filed on Nov. 12, 2007.

(30) Foreign Application Priority Data

Jan. 16, 2008   (EP) .................................... 08405011

(51) Int. Cl.
*H01R 12/00*   (2006.01)

(52) U.S. Cl.
USPC .......................................... 439/76.1; 439/876

(58) Field of Classification Search
USPC .................................... 439/66, 83, 876, 76.1
See application file for complete search history.

(56) References Cited

U.S. PATENT DOCUMENTS 4,654,470 A    3/1987    Feldman et al.
5,184,692 A *  2/1993    Moriarty ......................... 175/50

(Continued)

FOREIGN PATENT DOCUMENTS

EP    1501157 A    1/2005
JP    11026035 A   1/1999

(Continued)

*Primary Examiner* — Renee S Luebke
*Assistant Examiner* — Larisa Tsukerman
(74) *Attorney, Agent, or Firm* — Browdy and Neimark, PLLC (57) ABSTRACT

A junction box for a solar panel comprises a housing, a lid, a first connector and a second connector. The housing comprises sidewalls and a top wall defining an interior space. The first coupling comprises a first contact element and the second coupling comprises a second contact element. Said contact elements penetrate at least one of the sidewalls, so that the contact elements provide an electrical contact from external contact elements to internal contact elements, such as solder tails. Internal contact elements are arranged at least partially in said interior space. The top wall comprises an opening extending only partially in said top wall. Said opening is located such in the top wall that access to said solder tails in a substantially perpendicular direction to the surface of a solar panel for connecting the solder tail to the solar panel is provided.

22 Claims, 11 Drawing Sheets

U.S. PATENT DOCUMENTS

| | | | |
|---|---|---|---|
| 5,980,335 A * | 11/1999 | Barbieri et al. | 439/824 |
| 5,984,692 A * | 11/1999 | Kumagai et al. | 439/66 |
| 6,046,597 A * | 4/2000 | Barabi | 324/756.02 |
| 6,392,524 B1 * | 5/2002 | Biegelsen et al. | 336/200 |
| 6,543,940 B2 * | 4/2003 | Chu | 385/53 |
| 7,097,516 B2 * | 8/2006 | Werner et al. | 439/709 |
| 7,109,416 B1 * | 9/2006 | Reed | 174/50 |
| 7,291,036 B1 * | 11/2007 | Daily et al. | 439/487 |
| 7,621,756 B2 * | 11/2009 | Dittmann | 439/66 |
| 2003/0210549 A1 * | 11/2003 | Sears et al. | 362/265 |
| 2006/0180196 A1 * | 8/2006 | Lares et al. | 136/251 |

FOREIGN PATENT DOCUMENTS

| | | |
|---|---|---|
| JP | 2001-98856 A | 4/2001 |
| JP | 2001168368 A | 6/2001 |
| WO | 2006086588 A | 8/2006 |

* cited by examiner

JUNCTION BOX FOR A PHOTOVOLTAIC SOLAR PANEL

FIELD OF THE INVENTION

The invention relates to a device for affixing to a photovoltaic solar panel module in order to provide a connection between solar panel modules of a photovoltaic array or a connection between solar panel modules and other devices such as a bus system or cables.

PRIOR ART

Such devices are also known under the designation junction boxes or connection boxes. Such junction boxes are well known from prior art. Usually said junction boxes provide an electrical contact between contacts of a photovoltaic solar panel and cables which are connected to a further photovoltaic solar panel or to any other device, such as a distribution box or a bus system.

EP 1 501 157 shows an example of such a junction box. Contacts of a solar panel extend above the surface on which the junction box is arranged and protrude through openings into the interior of the junction box. Said contacts are received by a contact element that is arranged in the interior of the junction box. Furthermore the junction box comprises openings through which cables can be inserted into the interior of the junction box in order to be received by said contact element. The contact element provides an electrical contact between the contacts of a solar panel and the wire. Said junction box further comprises an opening in order to provide access to the interior of the box. The opening is sealed by means of a sealing ring and a lid.

Since the solar panels are usually exposed to effects of weather such as rain, snow, wind etc. it is particularly important that the junction boxes or connecting boxes have weatherproof properties. Such weatherproof properties include the resistance against moisture, water or temperature differences.

The inflow of water into the interior of such a junction box should be avoided under any circumstances, since it may cause short circuits and/or lead to corrosion of the metallic connection elements. The presence of water in the interior of a junction box is not only a result from water that enters through leaky portions of the junction box, but may also be the result of water condensation. However, the presence of water decreases the operational reliability and the lifetime of such a junction box.

Furthermore junction boxes are exposed to thermal differences that result in thermal expansion of the junction box itself. Such an expansion can lead to a malfunction of a sealing element, such as the above mentioned sealing ring.

Usually such an expansion leads to mechanical stresses which may lead to cracks in the boxes. Especially sensitive to such mechanical stresses are glued sections.

A further drawback of devices according to prior art is the manufacturing process. Still a high percentage of such a box is manufactured by hand. This leads to high costs. Furthermore quality issues may also arise, since precision and reliability of each craftsman is variable.

Quite often the electrical connection of the electrical contacts between the junction box and the solar panel are designed as a spring contacts. Such spring contacts are susceptible to oxidation and mechanical influences. Said negative influences can lower the efficiency of a solar panel arrangement.

SUMMARY OF THE INVENTION

An object of the present invention is to provide a junction box, which does not have the disadvantages of the junction boxes known from prior art. In particular the junction box shall be manufactured and/or applied to a solar panel in an automatic manner, while at the same time the electrical connection between elements of the junction box and the solar panel shall be optimized.

This object is achieved by a junction box for a solar panel having a housing, a lid, a first connector and a second connector. The housing comprises sidewalls and a top wall defining an interior space. The first coupling comprises a first contact element and the second coupling comprises a second contact element. Said contact elements penetrate at least one of the sidewalls, so that the contact elements provide an electrical contact from external contact elements to internal contact elements, such as solder tails. Internal contact elements are arranged at least partially in said interior space. The top wall comprises an opening extending only partially in said top wall. Said opening is located such in the top wall that access to said solder tails in a substantially perpendicular direction to the surface of a solar panel for connecting the solder tail to the solar panel is provided.

Due to the specific arrangement of the opening in the top wall access to the solder tails is being provided so that parts of a robot are introduceable in an effective manner in order to affix the solder tail to a solar cell. The remaining parts of the top wall covers the interior space as much as possible. This means that the junction box according to the present invention can be mounted in an automatic manner for example in an assembly line.

Preferably the top wall comprises an outer sidewall that extends substantially perpendicular from the top wall and that surrounds substantially the outer circumference of the top wall, so that an overflow space is defined by the top wall and the outer sidewall.

Preferably the opening is substantially surrounded by an inner sidewall which extends substantially perpendicular from said top wall. Such a sidewall limits the overflow space to the opening.

If the interior space is filled with a filling material excess filling material may flow into the overflow space defined by the top wall, the outer sidewall and the inner sidewall. The filling material is preferably a potting compound (pottant) or a foam.

Preferably filling material is injectable into the interior space through said opening, so that the interior space is fully filled with said filling material, and in that the opening is closeable with the lid. Preferably the filling material is a material that is injected in a liquid state and hardens after being injected. Preferably the filling material is a pottant or a foam.

Preferably the lid comprises a wall extending substantially perpendicular to the lid and having a shape that fits into the opening in the top surface.

Such a wall provides a good and easily sealable contact between the opening and the lid.

Preferably the lid comprises further embossments that are arranged such that they extend through the opening into the interior space when being mounted onto the housing. Due to said further embossments filling material is forced to flow through the opening into the overflow space, when said lid is mounted onto the housing when filled fully with filling material.

Due to that overflow the lid is connected to the housing in tightly sealed manner. The embossments are advantageous, since they reduce the volume in the interior space so that filling material and air that may be present is forced out of the interior space. Additionally a closure force is provided.

A method for manufacturing a junction box according to the present invention comprises the steps of
providing the first coupling with a first contact element and the second coupling with a second contact element;
connecting the first coupling and the second coupling with the housing;
providing each of the contact elements with a solder tail;
affixing the diode at the first contact element and at the second contact element.

With such a method a pre-mounted junction box is provided. Said junction box can be mounted on a solar panel.

A method for providing a solar panel with a junction box e.g. as defined above comprises the steps of:
Applying adhesive to the junction box base perimeter or flange;
arranging the junction box on a surface of a solar panel module;
affixing solder tail to the contacts of a solar panel;
filling the interior space of the housing with a filling material; and
mounting the lid on the top wall, so that parts of the lid, extend into the interior space of the housing.

Thereby the pre-assembled junction box can be mounted onto a solar panel in an effective and automatic manner. The arrangement of the opening giving access to the solder tail is a particular advantage in terms of automatic manufacturing.

A solder element for providing an electrical connection between a first electrical device and a second electrical device comprises a cylindrically shaped contact zone to be contacted to the first electrical device, a resilient zone and a cylindrically shaped transfer zone having a solder zone to be contacted to the second electrical device. The axes of the contact zone and of the transfer zone are axially arranged in alignment of a longitudinal axis. The resilient zone enables adjustment of the axial distance between the contact zone and the solder zone.

Such a solder element is particularly advantageous as the adjustment of the length enables the solder element to be used in a flexible manner.

Preferably the resilient zone is arranged between the contact zone and the solder zone.

Preferably the resilient zone is designed as a bending structure, wherein bending of said bending structure results in said adjustment. This allows an easy adjustment of the length.

The resilient section comprises at least one, preferably at least two, even more preferably at least three to six, resilient web.

Preferably the solder element is produced by a stamping and/or forming process.

BRIEF DESCRIPTION OF THE DRAWINGS

The drawings will be explained in greater detail by means of a description of an exemplary embodiment, with reference to the following figures:

FIG. 9 a-d show assembly steps of a junction box according to the present invention;
FIG. 10 a-c show views of a junction box of a further embodiment according to the present invention.

DETAILED DESCRIPTION OF THE PREFERRED EMBODIMENTS

With reference to the drawings possible embodiments are described. The drawings and the description illustrate preferred embodiments and shall not be construed to limit the invention, which is defined by the claims.

FIGS. 1 to 4 show a junction box according to the present invention. Such a junction box comprises preferably a housing 1, a lid 2, a first coupling 3 and a second coupling 4. The junction box according to the present invention is used to provide an electrical contact between a solar cell of solar panel and external contact elements such as cables etc. or other solar cells. Such solar panels have a typical size of 2200 mm×2600 mm, but can also be smaller or larger. With such solar panels voltages between 70 V and 500 V and currents between 0.1 amps and 10 amps can be produced. However, the junction box according to the present invention can also be used for solar panels providing higher or lower currents or voltages, respectively.

The housing 1 comprises sidewalls (here a first sidewall 11 and a second sidewall 12) and a top wall 13. The sidewalls 11, 12 extend from the top wall 13. An interior space 10 is defined by said sidewalls 11, 12 and said top wall 13. Said interior space 10 is provided to accommodate electrical contact elements which are in an electrical contact with a solar cell of a solar panel. When the junction box is mounted on a solar panel the interior space 10 shall be sealed off from environmental influences such as water, air etc. to prevent oxidation of the electrical contact elements. Afterwards the terms external and internal will be used. The term external or exterior space is to be understood that it comprises everything that is arranged outside of the housing 1, whereas the term internal is to be understood as to comprise everything that is arranged within the interior space 10.

Preferably the housing 1 is made of plastics. Preferably polycarbonate, for example Lexan 940-701, is used to provide the housing. The housing 1 is preferably injection molded.

Figure 1:
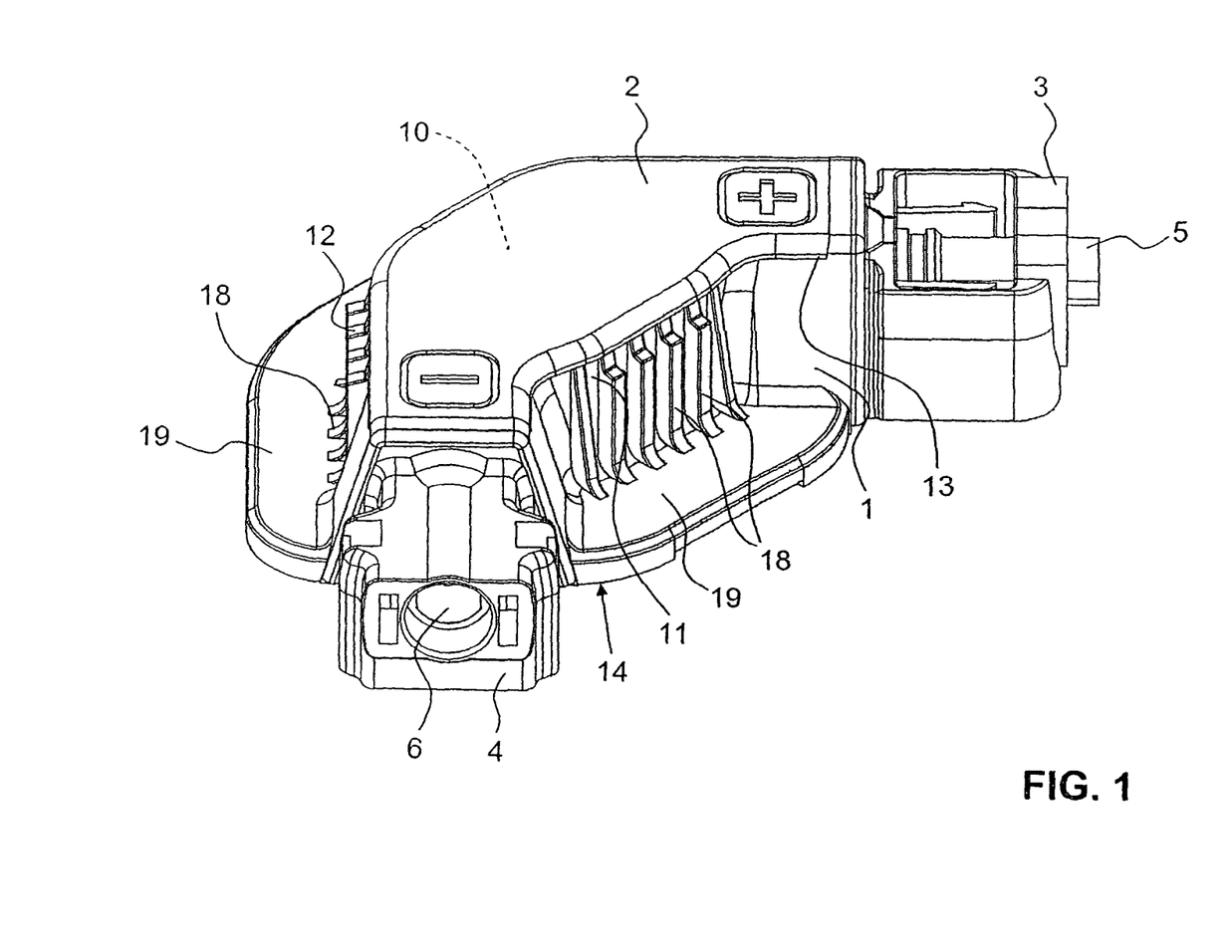
FIG. 1 shows a perspective view of a junction box according to the present invention with a lid according to the present invention.

Furthermore the housing 1 in that embodiment comprises a bottom wall 14 that is designed as a flange 19. Said flange 19 limits the interior space 10 on a side that is opposite to the top wall 13. When the housing 1 is arranged in the surface of a solar panel, said bottom wall 14 or flange 19 faces the surface of the solar panel either its frontside or its backside. In the embodiment as shown, the flange 19 extends substantially parallel to the top wall 13 from the sidewalls 11, 12 in the external direction. In that case actually the surface of the solar panel limits the interior space 10, wherein the flange 19 acts as a support element and contact element.

In order to provide the sidewalls 11, 12 with a higher stiffness, said sidewalls 11, 12 may comprise a plurality of ribs 18. In the embodiment as shown in FIG. 1 said ribs extend on the external surfaces of the sidewalls 11, 12. Additionally or alternatively said ribs can also be arranged on the internal surfaces of the sidewalls 11, 12 that face the interior space 10. If the sidewalls 11, 12 are already stiff enough, the ribs 18 may be omitted.

The first coupling 3 and the second coupling 4 extend from the housing 1. The first coupling 3 comprises a first contact element 5 and the second coupling 4 comprises a second contact element 6. Said contact elements 5, 6 penetrate at least one of the sidewalls. Thereby said contact elements 5, 6 provide an electrical contact from the external side to the interior side or interior space 10, respectively. With other words an electrical contact is provided by means of said contact elements 5, 6 from an external contact element to internal contact elements. An external contact element can be for example a cable of a bus system linking several solar panels. An internal contact element can be a solder tail 7 that is arranged to contact a solder zone of a solar cell. Preferably such a solder tail 7 is arranged such that its main parts are arranged in the interior space 10, whereas some parts extend from the interior space 10 to the external space (e.g. environment).

Preferably the first coupling element 3 and the second coupling element 4 are made of plastics such as polycarbonate. This means that said coupling elements 3, 4 can be injection molded. Alternatively the housing 1, the first coupling 3 and the second coupling 4 can be molded in one piece.

As it can be seen from FIG. 1 the mechanical design the first coupling 3 and the second coupling 4 are different. Such a coded design (male/female) has the advantage that the user does not contact a cable in a wrong coupling.

Figure 2:
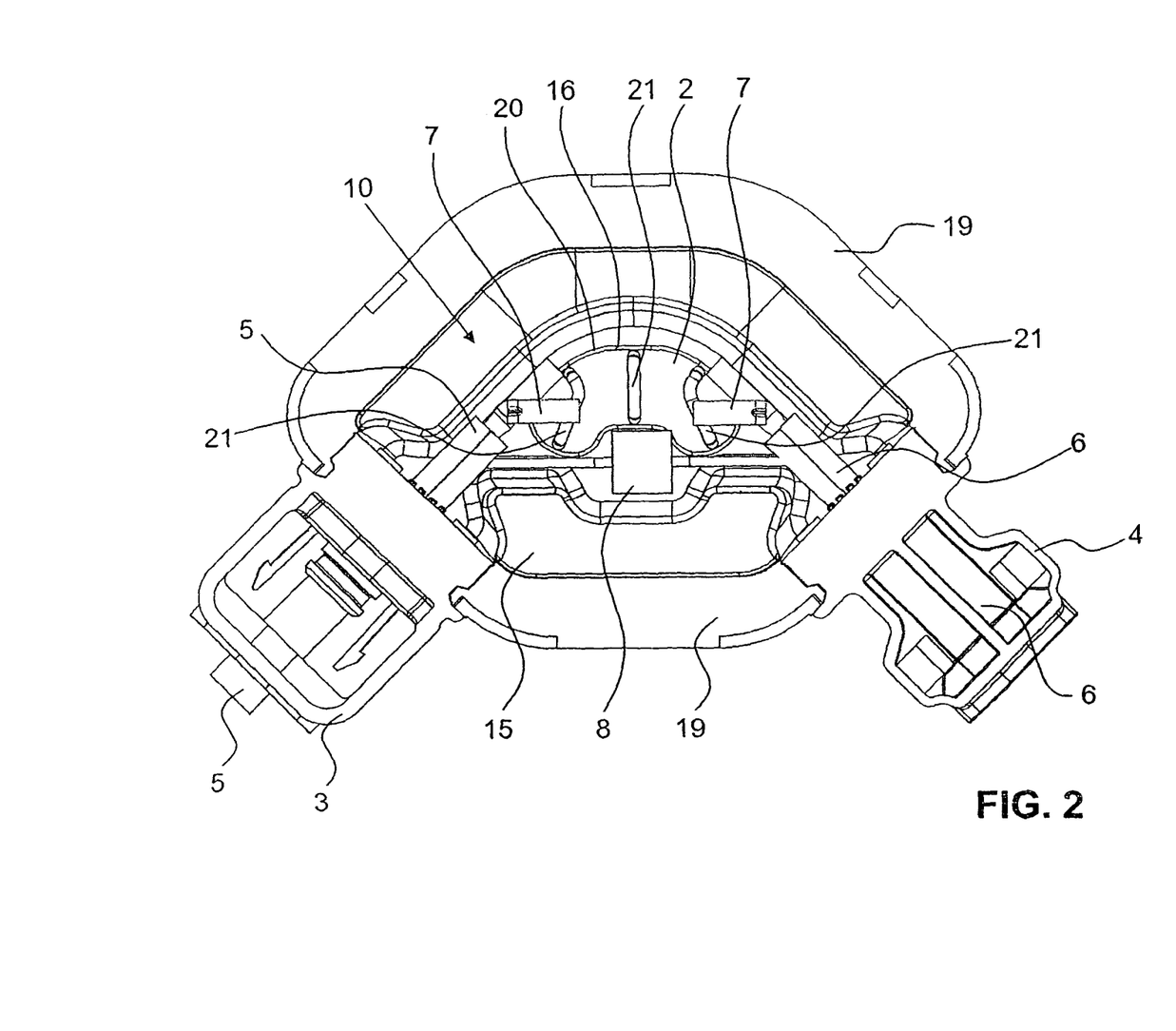
FIG. 2 shows a bottom view of the junction box of FIG. 1.

FIG. 2 shows the junction box from the bottom side. Here it can be seen that the bottom wall 14 is designed as flange 19 that extends over the whole length of the sidewalls 11, 12. However, the flange 19 is arranged such that it does not extend into the interior space 10. Hence a bottom opening 15 is provided which is limited by the sidewalls 11, 12. In a mounted state said bottom opening 15 is closed by a surface of the solar panel. Preferably the flange 19 is glued to the surface of a solar panel by means of hot melt adhesive, such as a dow corning HM2500, which is a reactive hot melt neutral cure adhesive.

Figure 9A:
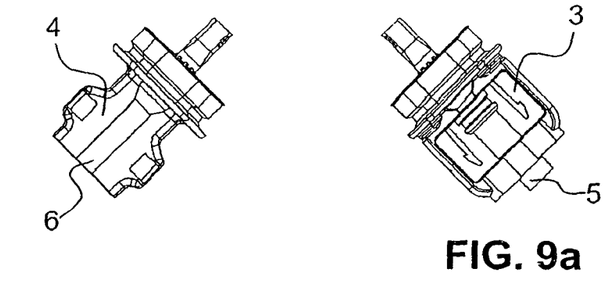
Figure 9B:
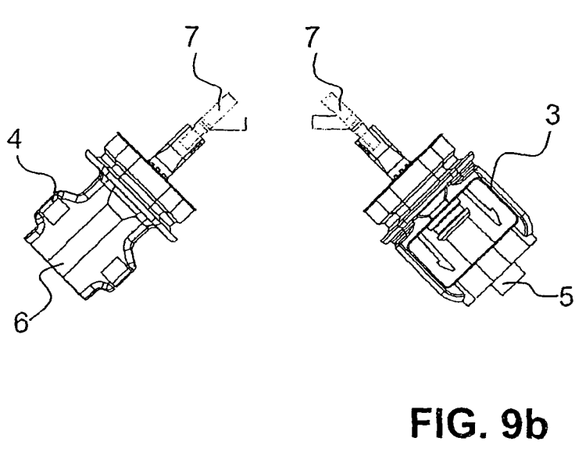
Figure 9C:
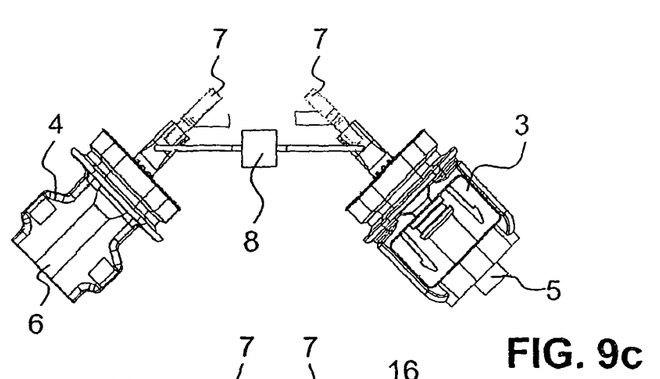
Figure 9D:
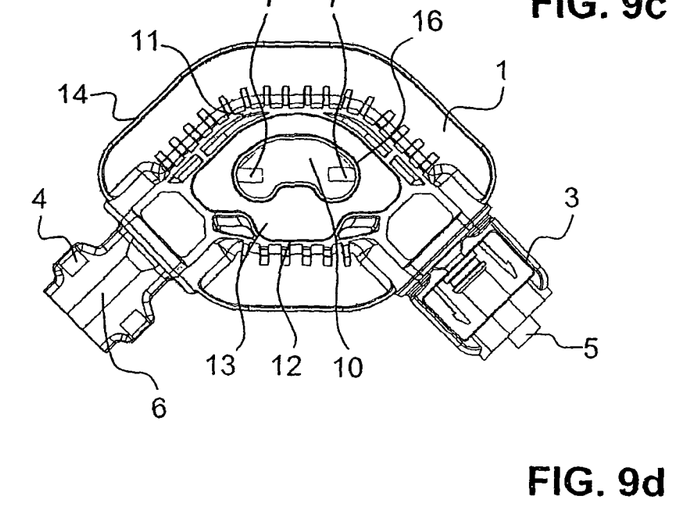

The junction box according to the present invention will be placed on a surface of a solar panel. Preferably the junction box is affixed to said surface by means of an adhesive. Afterwards the solder elements will be connected to the solder zones of a solar cell. After that the junction box according to the present invention is mechanically and electrically connected to a solar panel and the interior space 10 will be filled with a filling material, such as a pottant or potting material. The filling material can also be a foam. Said filling material is insertable through the opening 16 that is arranged in the top wall 13. Due to the fill in of the filling material the electrical contacts will be covered by the foam so that oxidation is prevented. Furthermore the filling material may have flame retardant properties. The opening 16 receives parts 20, 21 of the lid 2, as they are described by means of FIG. 5. The opening 16 is located such in the top wall that, when the lid is not present, access to said electrical contact elements 7 is provided. Preferably said access is provided in a substantially perpendicular or orthogonal direction to the surface of a solar panel. This means that a robot in a production line is able to quickly contact the electrical contact elements 7 to corresponding contact zones of a solar panel. Reference is made to FIG. 9d where this situation is clearly visible. Due to the specific shape of the opening 16 that provides access preferably to the electrical contact elements 7 only, the other elements that are arranged in the interior space 10 are protected by the remaining parts of the top wall 15. The opening 16 in the top wall 15 is preferably designed as small as possible in order to allow access to the electrical contact elements 7 only. This means that the remaining parts of the top wall 15 are as large as possible.

Preferably the pottant or filling material is a silicone rubber such as an RTV pottant. A memontive (GE) TSE3664 condensation-cure flame retardant RTV can be used. TSE 3664 is a two-component condensation cure silicone rubber (RTV).

In further embodiments it may also be possible that the flange 19 extends from the sidewalls 11, 12 in direction of the interior space 10 as well as in the direction to the external side. In such an embodiment the bottom opening 15 is limited by the flange 19. However, the surface of the solar panel still limits the interior space 10 in the area of the bottom opening 15.

Alternatively it is also possible that the flange 19 or bottom wall 14 extends from the sidewalls 11, 12 towards the interior space 10 only. Also in that embodiment the bottom wall 14 comprises a bottom opening 15 through which the solder tail 7 extend to the external side. As mentioned in the above mentioned designs, the surface of the solar panel still limits the interior space 10 in the area of the bottom opening 15.

As it can be seen in FIG. 2 the first contact element 5 and the second contact element 6 extend through the sidewalls 11, 12 from the external side or exterior space into the interior space 10 of the housing 1. Both contact elements 5, 6 are connected to an internal contact element 7. The internal contact element 7 is preferably a solder tail which is described by means of FIG. 7. Additionally the first contact element 5 is connected to the second contact element 7 by means of a diode 8. The opening 16 is designed such that the diode can be arranged such that it is protected by the remaining parts of the top wall 13. This means that the diode 8 is preferably not visible from the exterior when viewed in a direction perpendicular from the top wall 13. However, in other embodiments the diode 8 is arranged such that it is at least partly visible from the exterior when viewed in a direction perpendicular from the top wall 13. Such an arrangement is advantageous for quality checks.

Such a diode acts as a security device for bypass protection. Preferably a silicon diode rated 1000V/10 A is used.

Figure 3:
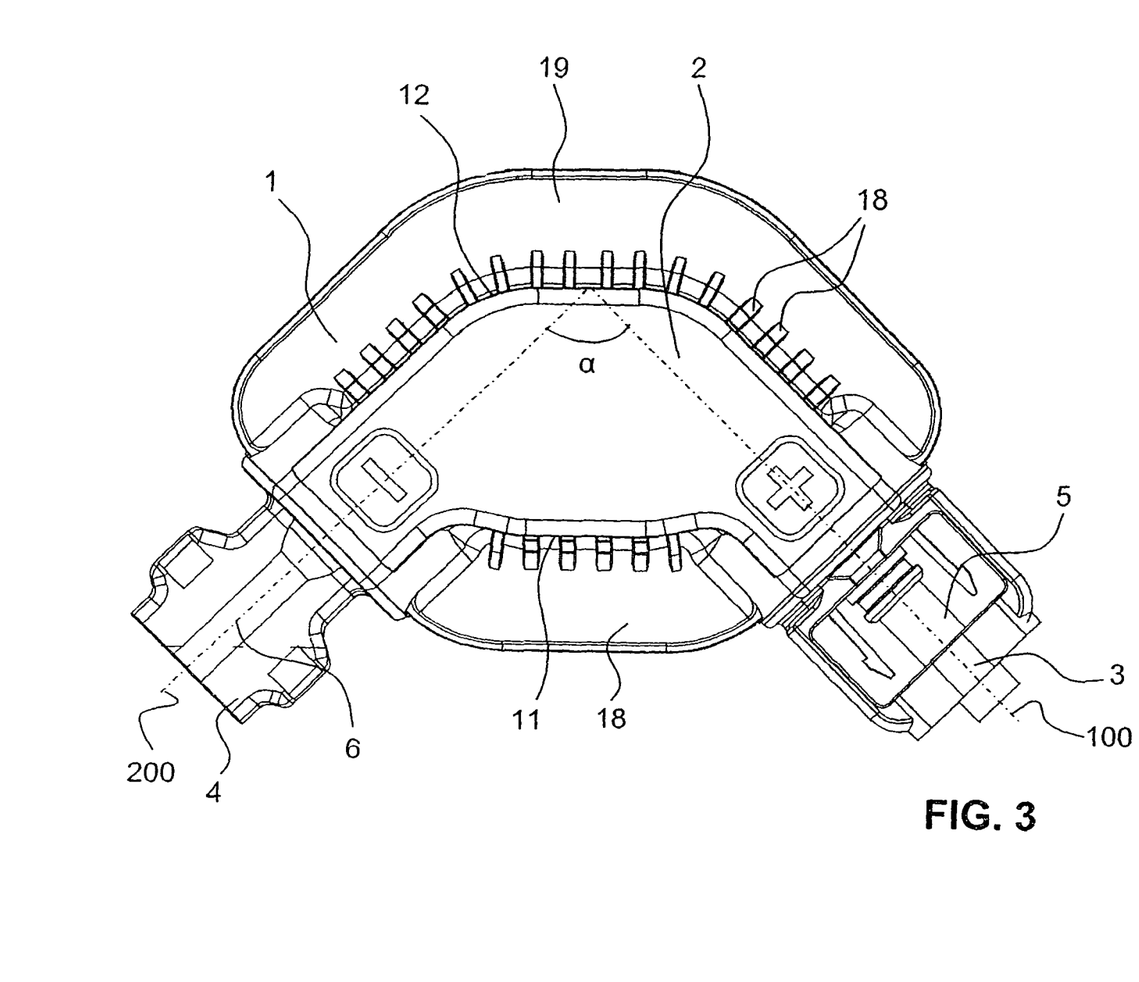
FIG. 3 shows a top view of the junction box of FIG. 1.

FIG. 3 shows a top view of the junction box according to the present invention. This figure is mainly used to explain the angular arrangement of the first coupling 3 and the second coupling 4. A first axis 100 runs through the first coupling element 3 with the first contact element 5 and a second axis 200 runs through the second coupling element 4 with the second contact element 6. If a plug is connected to said first or second coupling elements 3, 4, it will be inserted in direction of said axis. Preferably the first axis 100 and the second axis 200 lie in the same plane, which plane is parallel to the surface of a solar panel or to the bottom surface 14 or flange 19, respectively.

As it can be seen in FIG. 3 the first coupling element 3 and the second coupling element 4 are arranged angular with respect to each other. With other words, the first axis 100 is angular to the second axis 200. This is designated in the figure by means of an angle α. Preferably angle α is between 5° and 175°. However, other angles, larger than 175° or smaller than 5° are also possible. An angle α between 75° and 125° is particularly preferable, since the effect of the mechanical force that results from the cable (external connector) onto the couplings is minimized while the junction box is mounted. This is the case when the junction box is mounted such that the bisecting line of angle α is directed downwards, e.g. towards the roof of a building or the floor of a solar power plant etc.

Alternatively the plane in which the two axis 100, 200 are arranged can also be angular to the surface of a solar panel. This means that the first coupling 3 and the second coupling 4 extend oblique with respect to the top wall 13 or the bottom wall 14. This is a particular advantage if the solar panel is arranged tilted, since due to the oblique arrangement the couplings extend in a direction that is substantially perpendicular to the roof of building etc.

Figure 4:
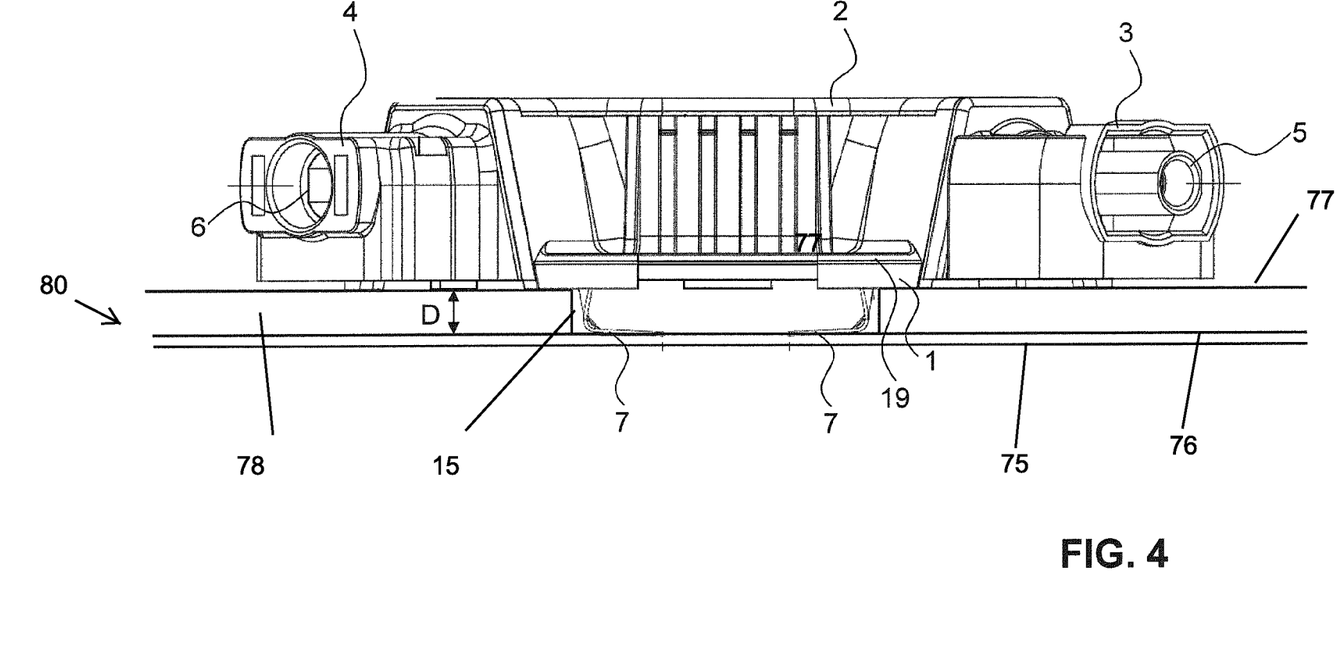
FIG. 4 shows a side view of the junction box of FIG. 1.

FIG. 4 shows a side view of the junction box according to the present invention attached to a photovoltaic solar panel 80. In this view one is able to see that parts of the internal contact elements or solder tails 7 extend over the surface of the flange 19 or bottom wall 14. Hence said parts extend from the interior space 10 over said surface to the external side or exterior space through the opening 15*kl*. If the junction box is mounted onto a solar panel 80, said parts will be connected to the solar cell, preferably via a soldered connection. Alternatively a welded or crimped connection is also thinkable. The solder tails extend with a measure D from the outer surface of the bottom wall 14. The measure D is preferably equal to or larger than the thickness of a glass pane of a solar panel, so that the solder tails 7 are able to penetrate through a hole from one side of said glass pane to the other side of said glass pane. Preferably D is between 1 mm and 10 mm. In other embodiments D is between 3 mm to 5 mm. The photovoltaic solar panel 80 includes at least a carrier layer 78 and a solar cell 75 that is arranged on a front side 76 of the carrier layer 78, wherein the junction box is arranged on a back side 77 of the carrier layer 78.

Figure 5A:
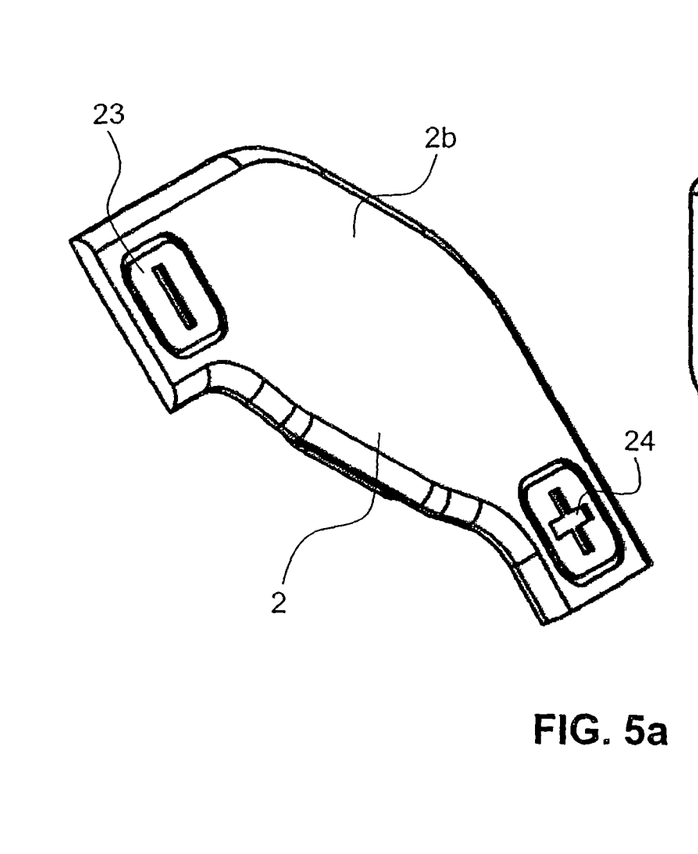
FIG. 5a-b show a perspective view of the lid for the junction box according to FIG. 1.
Figure 5B:
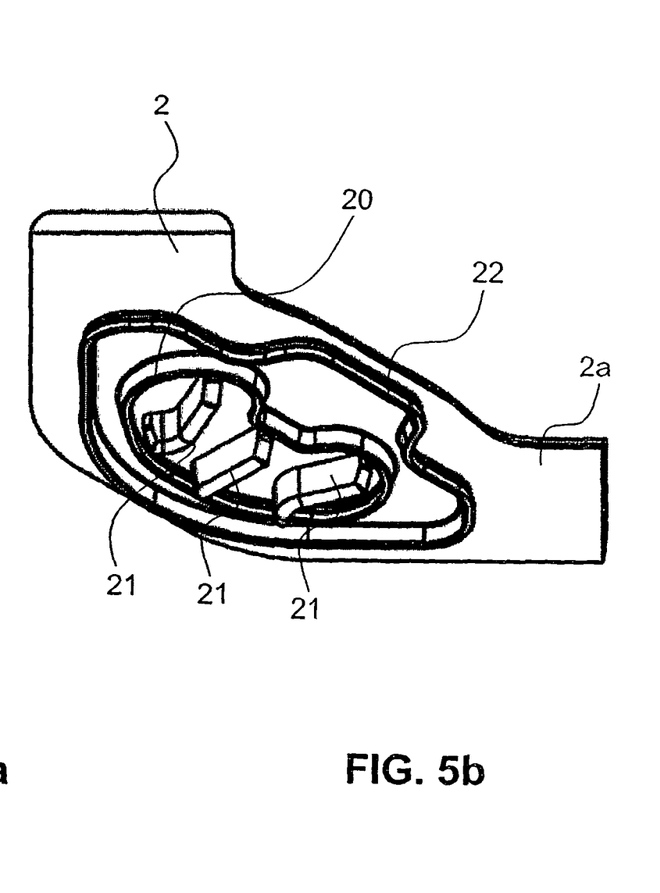

FIGS. 5*a* and 5*b* show the lid 2 from the front side (FIG. 5*a*) and from the back side (FIG. 5*b*). Said lid 2 has a shape that is substantially congruent with the surface of the top wall 13.

On the bottom surface 2*a* which faces the top wall 13 of the housing 1 when being mounted thereto, the lid comprises a first wall 20. Said first wall 20 extends substantially perpendicular from the bottom surface 2*a*. The wall 20 has a shape that is designed such that it fits around the outside of the opening 16 in the top wall 13. The wall 20 and the first sidewall 11 are designed such that there is a gap between the wall 20 and the first sidewall 11 of the opening 10. Said gap allows filling material to flow out as described hereinafter. In alternative embodiments the wall 20 is designed such that it fits into the opening 16 in the top wall 13. Also in that embodiment the wall 20 and the first sidewall 11 are designed such that there is a gap between the two of them. In the present embodiment the wall 20 is designed as a closed loop. However, the wall 20 can also be designed as having several sections with interruptions.

Additionally the lid comprises further embossments 21. Said embossments 21 extend also substantially perpendicular to the bottom surface 2*a*. The embossments 21 are arranged within the wall 20. Preferably the embossments 21 have a larger height than the wall 20.

Also on the bottom surface 2*a* there is arranged a second wall 22 that surrounds the first wall 21. As the first wall 20 and the embossment 21 said second wall 22 extends also perpendicular to the bottom surface 2*a*.

On the top surface 2*b* of the lid 2 the lid comprises indicators 23 and 24. Such indicators 23, 24 indicate which polarity needs to be contacted to the respective coupling 2, 3.

Preferably the lid 2 is made of plastics. Preferably polycarbonate, for example Lexan 940-701, is being used to provide the housing. The lid 2 is preferably injection molded.

Figure 6A:
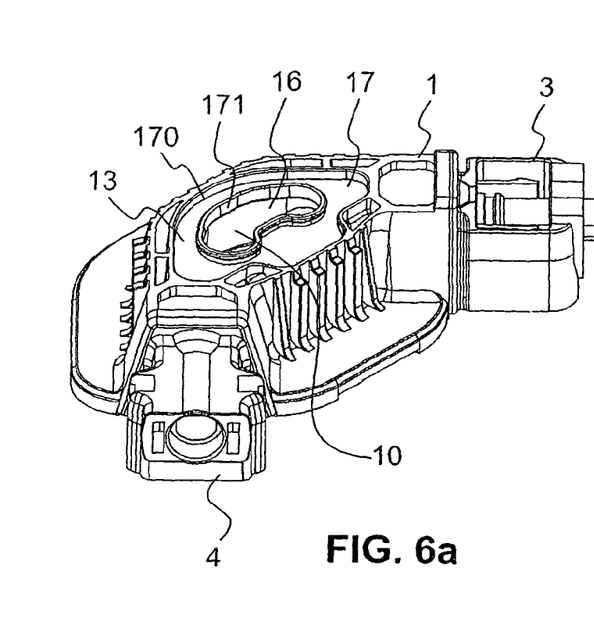
FIG. 6a-b show the junction box according to FIG. 1 without a lid.
Figure 6B:
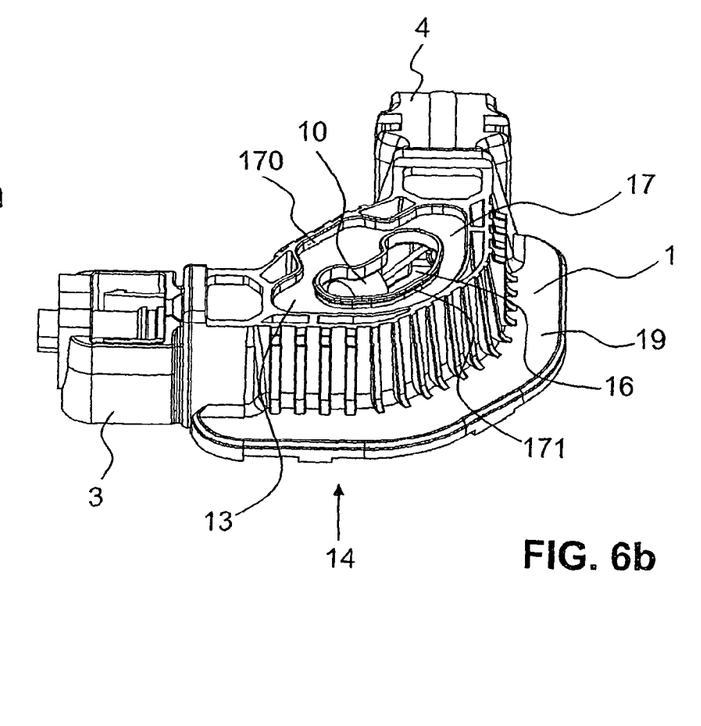

FIGS. 6*a* and 6*b* show the junction box according to the present invention without the lid 2. As it can be seen the top wall 13 comprises an opening 16. The opening 16 is surrounded by an inner sidewall 171. This inner sidewall 171 extends preferably perpendicular from the top wall 13. Furthermore the opening 16 is fully surrounded by the inner sidewall 171. An outer sidewall 170 is arranged around the outer boundary of the top wall 13. Preferably the top wall 13 is fully surrounded by the outer sidewall 170.

The top wall 13, the outer sidewall 170 and the inner sidewall 171 provide a space which can be designated as overflow space 17. Before the lid 2 will be added to the housing 1, the interior space 10 will be fully filled with filling material. As the lid 2 will be connected to the housing 1 some parts of the filling material will overflow from the interior space 10 to the overflow space 17 due to the embossments 21 and/or the first wall 20 that are arranged on the inner surface 2*a* of the lid 2. As there is a gap between the wall 22 of the lid 2 and the first sidewall 11 of the opening 10 filling material can flow through that gap as the lid is being pushed into position. Hence the filling material is forced to flow through the opening 16 in the top wall 13 into the overflow space 17. Since the filling material is forced to flow into the overflow space 17, said filling material is present in the overflow zone 17 as well as between the inner sidewall 171 and the first sidewall 20 of the lid 2. Therefore the filling material also acts as sealing means between the lid 2 and the housing 1.

Figures 7A, 7B:
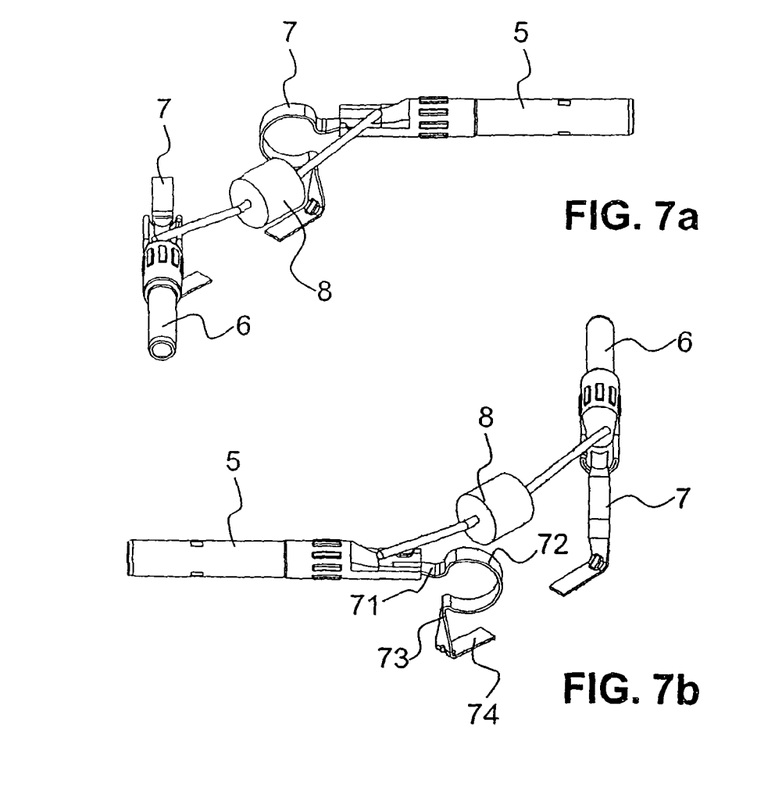
FIG. 7a-b show a connector element that is arranged in the junction box.

FIGS. 7*a* and 7*b* show the contact elements 5, 6 together with the internal contact elements 7 and the diode 8. The design of the contact elements 5, 6 is such that they can receive an external female or male connector on one end. On the other end the internal contact element here the solder tail 7 is connected to the contact elements 5, 6.

The internal contact element or solder tail 7 comprises preferably a contact zone 71 through which the solder tail 7 is connected to the first contact element 5 or the second contact element 6, respectively. A resilient zone 72 is arranged adjacent to the contact zone 71. In the present embodiment the resilient zone 72 is shaped as an arc. Said arc or the resilient zone 72 can also be designated as bending structure, as the adjustment of the length of the solder element results in a bending motion in the arc. A transfer zone 73 links the resilient zone 72 to the actual solder zone 74. The resilient zone 72 is especially useful to adjust the distance D between the solder zone 74 and the surface of the glass pane of a solar panel assembly in a resilient member. This allows a fully automatic manufacturing process. The solder zone 74 is connectable to the solar cell of a solar panel assembly.

Figures 8A, 8B:
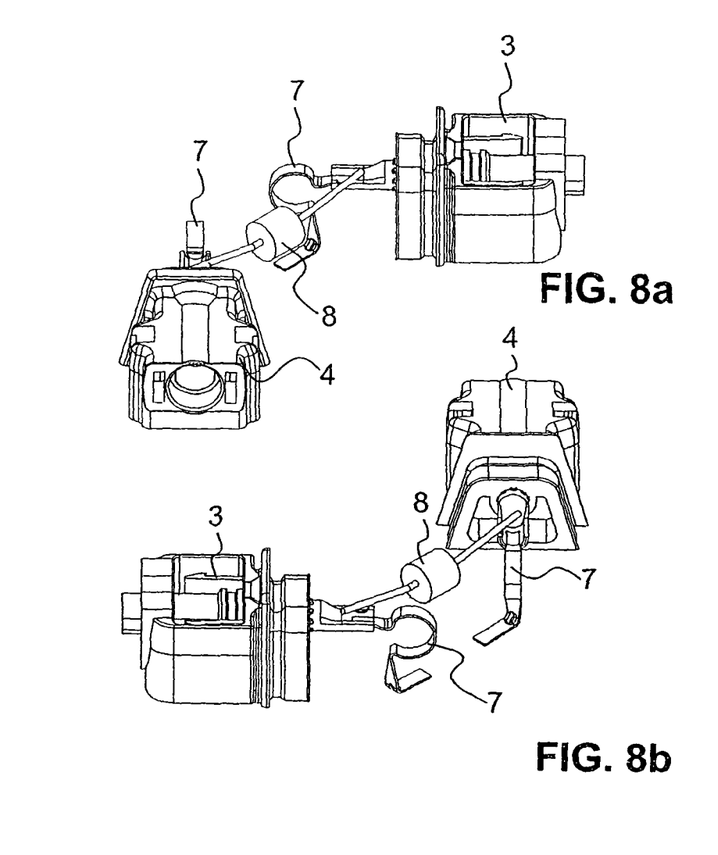
FIG. 8a-b show the connector element of FIG. 7 with a coupling element.

FIGS. 8*a* and 8*b* show the contact elements 5, 6 together with the internal contact elements 7 and the diode 8 arranged within the first coupling 3 and the second coupling 4. Preferably the contact elements 5, 6 are arranged within respective coupling 3, 4 and fixed by means of an ultrasonic welding process.

FIG. 9*a*-9*d* illustrate a method for manufacturing a junction box according to the present invention.

The method for manufacturing a junction box according to the present invention comprises the steps of:
  providing the first coupling 3 with a first contact element 5 and the second coupling 4 with a second contact element 6; (FIG. 9*a*)
  connecting the first coupling 3 and the second coupling 4 with the housing 1 (FIG. 9*d*).
  providing each of the contact elements 5, 6 with a solder tail 7; (FIG. 9*b*)
  affixing the diode 8 at the first contact element 5 and at the second contact element 6; (FIG. 9*c*)

The first contact element 5 and the second contact element 6 are preferably contacted to the first coupling 3 and the second coupling 4 by means of an ultrasonic welding or a thermal insertion procedure. However, it is also possible to insert the contact elements 5, 6 into a mold in which the plastic is being molded.

The solder tails 7 are preferably welded to the contact elements by means of an automatic resistance welding machine. The same applies to the diode.

The first coupling 3 and the second coupling 4 are connected to the housing 1 means of an ultrasonic welding procedure.

The result is a pre-assembled junction box that is ready to be connected to a solar panel. These steps are designed to perform them on a fully automatic assembly line, so that the junction box according to present invention can be provided in a cost effective manner.

A method for providing a solar panel with a junction box according to the present invention comprises the steps of:

Applying adhesive to the junction box base perimeter or flange 19;

affixing the junction box on a surface of a solar panel module;

affixing solder tail to the contacts of a solar panel;

filling the interior space 10 of the housing with a filling material completely; and mounting the lid 1 on the top wall 13, so that parts 20, 21 of the lid 2, extend into the interior space 10 of the housing.

The junction box is affixed by means of an adhesive as it is described above.

As it can be seen in FIG. 9*d* the opening 16 is arranged such that access to the solder tails 7 is being provided through the opening 16. Access is provided in a direction substantially perpendicular to the surface of the solar panel. This means that parts of a robot in an assembly can enter into the interior space 10 through the opening 16 in order to solder the solder tails 7 to the solder zone of the solar cell.

Figure 10A:
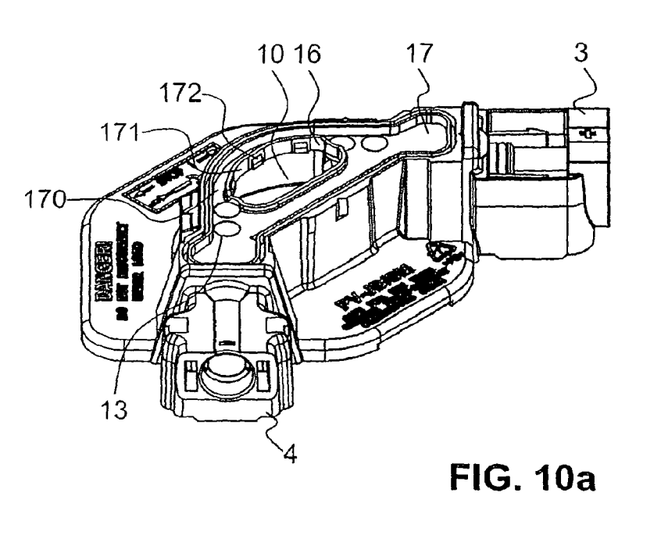
Figure 10B:
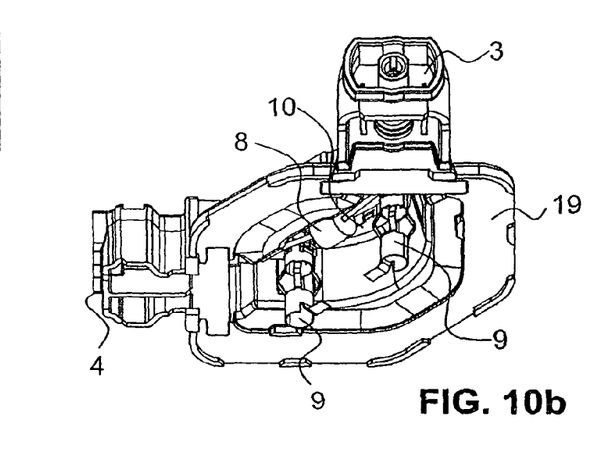
Figure 10C:
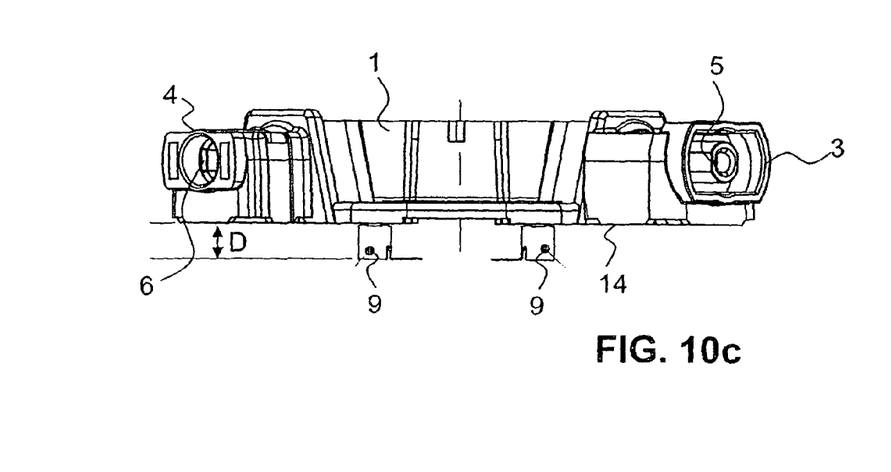

FIGS. 10*a*-10*c* show a further embodiment of a junction box according to the present invention. It is noted that features of this embodiment can be combined with features of other embodiments and vice-versa to further embodiments.

The junction box 1 according to this embodiment comprises sidewalls 11, 12 that are designed stiff enough that the placement of ribs in order to stiffen the sidewalls 11, 12 is not necessary. Furthermore the inner sidewall 171 that encompasses the opening 16 in the top wall 13 comprises snap-in elements 172 for securing the lid 2.

Additionally by means of this embodiment a further embodiment of a solder tail is shown. Said solder tail is designated with reference numeral 9. However, it has to be noted that such a solder tail 9 which may also be designated as solder element or solder tag can be used not only with the junction box as described herein, but with every other electrical device. The same applies to the solder tail 7 as it is described above.

FIGS. 10*b* and 10*c* show that the solder tail 9 is arranged in the same manner as in the previous embodiment. Parts of the solder tails 9 extend by a protruding height having a measure D from the outer surface of the bottom wall 14. The measure D is preferably equal to or larger than the thickness of a glass pane of a solar panel, so that the solder tails 9 are able to penetrate through a hole from one side of said glass pane to the other side of said glass pane. Preferably D is between 1 mm and 10 mm. In other embodiments D is between 3 mm to 5 mm.

Figure 11A:
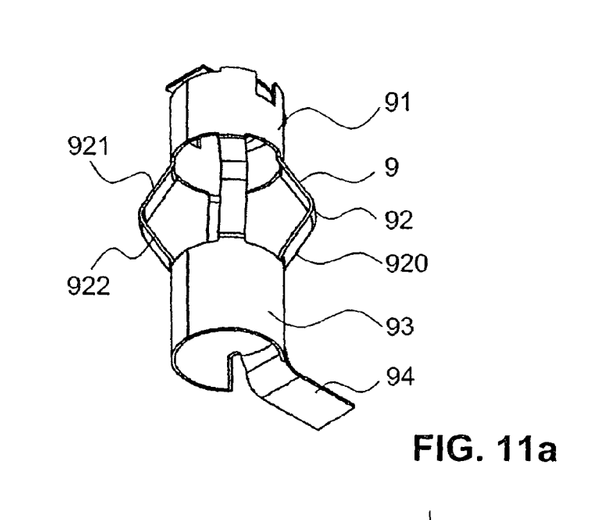
FIG. 11a-d show views of a solder element and
FIG. 12a, b show views of a weather cover or junction box according to a further embodiment.
Figures 11B, 11D:
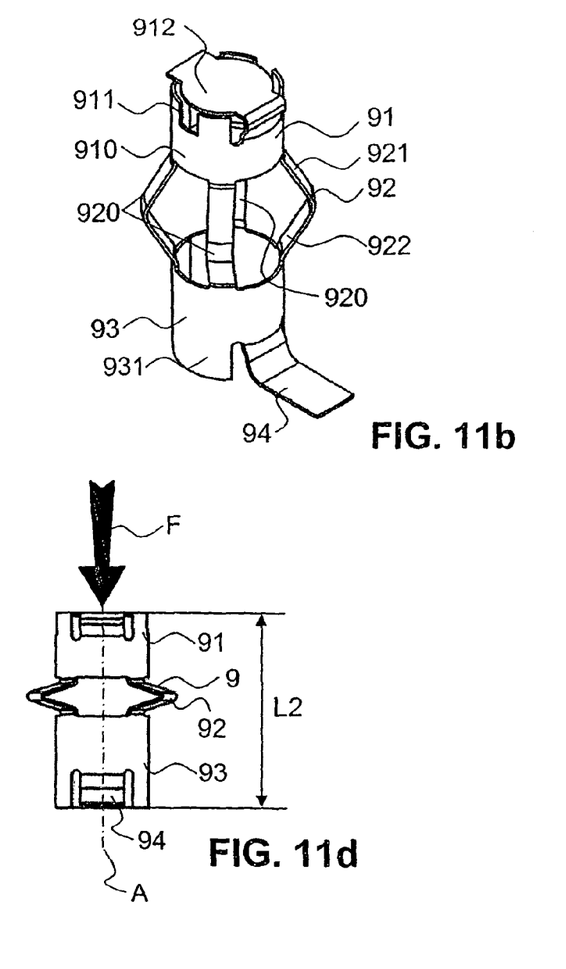

FIGS. 11*a* to 11*b* show the solder element 9 in a perspective view. The solder element 9 preferably comprises a contact zone 91, a resilient zone 92, a transfer zone 93 and a solder zone 94. The solder element 9 comprises a middle axis A along which the length of the solder element 9 is adjustable. The length is considered to be the distance between the contact zone 91 and the solder zone 94.

The contact zone 91 is provided to establish an electrical contact with a first electrical device (e.g. the first contact element 5 or second contact element 6). Preferably the contact zone 91 is designed such that it may be connected to the electrical device by means of a solder connection, welded connection or a crimped connection etc. In the present embodiment the contact zone 91 is formed as tubular body 910. Said tubular body 910 comprises a first end having several cut outs 911 and a lid portion 912 and a second end on which the resilient zone 92 is formed. However, the contact zone 91 can also be designated as being cylindrical. The term cylindrical is to be understood as having a circular, rectangular, oval, triangular or elliptical shaped as viewed along axis A. Furthermore it is possible that the contact zone 91 is formed as a cylinder as defined above and that said cylinder is partly interrupted, preferably along the longitudinal axis. The interruption results in a gap in the cylindrical body. It is also possible that instead of the interruption the parts of the cylindrical or tubular body overlap each other. The lid portion is welded to the connectors 5, 6 and provides an electrical connection between the connectors 5, 6 and solder element 9 or the solar panel, respectively.

The resilient zone or compliant zone 92 comprises at least one, here four, resilient or compliant webs 920. The resilient webs 920 are designed such that they are deformable in order to adjust the length of the solder element 9, i.e. the distance between the contact zone 91 and the solder zone 94. Said resilient webs are also designed as a bending structure, as the adjustment of the length of the solder element 9 results in a bending motion to parts of the web 920. In the present embodiment the resilient webs 920 comprises an upper section 921 and a lower section 922. The upper section 921 is connected to the tubular body 910 and extends angular with respect to the middle axis A. In the present embodiment the upper section 921 extends such that the distance between the middle axis A and the web 920 increases with increasing length of the upper section 921. The lower section 922 is connected to the upper section 921 and extends contrary to the upper section 921. This means for the present embodiment that the distance between middle axis A and the web 920 decreases with increasing length of the lower section 922. This leads to a structure in which the webs 920 extends over a virtual circumference that is defined by the tubular body if viewed along the axis A.

In other embodiments of a solder element or solder tail 9 it is also possible to provide a resilient zone 92 having a different structure. For example it is possible that the upper section 921 is arranged such that the distance between the upper section 921 and the axis A decreases with increasing length of the web 920. This means that the web extends into the interior of that virtual circumference that is defined by the tubular body.

The webs 920 of the resilient zone 92 are connected to the transfer zone 93 which is also designed as a tubular body 931. Preferably the transfer zone 93 has the same diameter as the contact zone 91. However, the diameter can also be larger or smaller than the diameter of the contact zone 91. However, the transfer zone 93 can also be designated as being cylindrical. The term cylindrical is to be understood as having a circular, rectangular, oval, triangular or elliptical shaped as viewed along axis A. The transfer zone 93 that is formed as a cylinder as defined above may be partly interrupted, preferably along the longitudinal axis. The interruption results in a gap in the cylindrical body. It is also possible that instead of the interruption the parts of the cylindrical or tubular body overlap each other.

The solder zone 94 is provided to establish an electrical contact with a second electrical device (e.g. a solar panel). Said solder zone 94 extends from the transfer zone 93. In the present embodiment there is one solder zone 94 arranged but in other embodiments it is also possible to arranged more than one solder zone 94. The solder zone 94 here extends angular from the tubular body of the transfer zone 93.

Figure 11C:
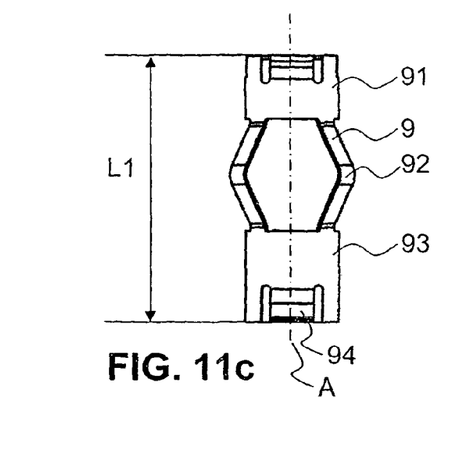

FIG. 11c shows the solder element 9 according to the present invention in a normal non-compressed state, whereas FIG. 11d shows the solder element 9 in a compressed state. The length of the solder element 9 in the normal non-compressed state is designated with L1. The elongation of the solder element 9 can be positive or negative. Positive elongation results in a length that is larger than length L1, whereas negative elongation results in a length that is shorter than length L1. Negative elongation is shown in FIG. 11d, whereas the length of the solder element 9 is designated with L2. Due to the design of the compliant section 92, the solder element 9 does not return from a compressed state into the non-compressed state as soon as the force F disappears. However, in other embodiments where the compliant section 92 is resilient the solder element 9 does return from a compressed state into the non-compressed state.

Preferably the solder element 9 is made of copper, which allows compliant and permanent deformation. In other embodiments brass, bronze or aluminium may also be used.

Usually the force F is built up during a mounting process. To give an example: If the solder element 9 according to the present invention is used in a junction box to provide a connection between photovoltaic solar panels, the force F is provided by a mounting tool which crushes the solder element 9. The length L2 of the solder element after that is such that the solder section 94 can be connected to the solar panel.

Figure 12A:
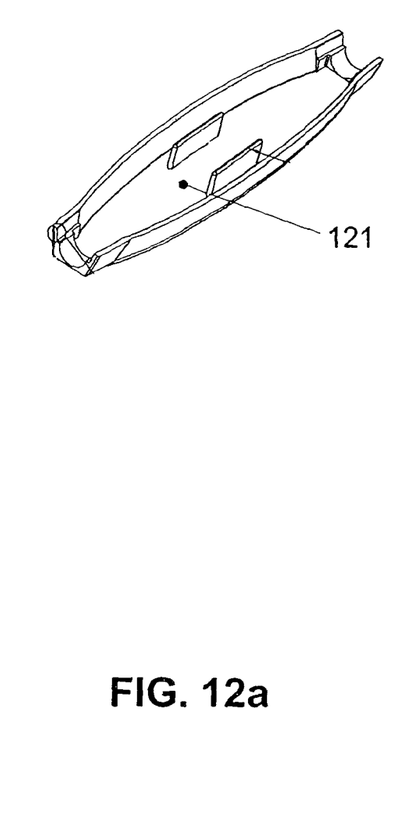
Figure 12B:
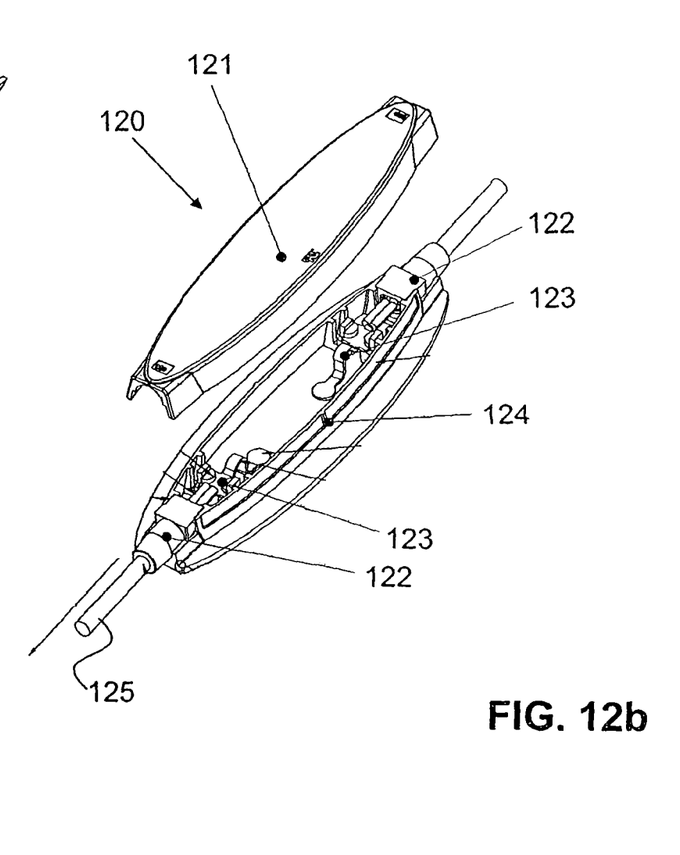

FIGS. 12a and 12b show a weather cover 120 which can also be designated as a junction box having a lid 121 and a base plate 124. The features of this embodiment can be combined with the features of the embodiment as disclosed herein. The base plate 124 provides an interior space for connector strips 123 which are connected to a solar panel (not shown) on the one hand and to a cable 125 via strain relieves 122 on the other hand. The base plate 124 comprises a flat bottom surface to be connected to a solar panel by means of an adhesive or a tape. Preferably the lid 121 and the base plate 124 are made of a rigid polymeric material.

The lid 121 is to be arranged onto the base plate 124. Preferably the lid 121 is connected to the base plate 124 via a snap-fit. For the reason the lid 121 and the base plate 124 comprises protrusion which provide the snap-fit. The snap-fit also provides a sealed connection between the base plate 124 and the lid 121. Furthermore it is possible to fill in the interior space with a filling material as disclosed above.

With such an assembly according to FIGS. 12a and 12b it is possible to provide a weather cover for connecting a first solar panel with a second solar panel.

LIST OF REFERENCE NUMERALS

1 housing
2 lid
3 first coupling
4 second coupling
5 first contact element
6 second contact element
7 solder tail

8 diode
9 solder tail, solder element
10 interior space
11 first sidewall
12 second sidewall
13 top wall
14 bottom wall
15 bottom opening
16 opening
17 overflow space
18 ribs
19 flange
20 first wall
21 embossments
22 second wall
71 contact zone
72 resilient zone
73 transfer zone
74 solder zone
91 contact zone
92 resilient zone, compliant zone
93 transfer zone
94 solder zone
120 weather cover
121 lid
122 strain relieves
123 connector strips
124 base plate
125 cable
170 outer sidewall
171 inner sidewall
172 snap-in elements
910 tubular body
911 cut out
912 lid
920 compliant web
921 upper section
922 lower section

The invention claimed is:

1. Junction box for a solar panel comprising
a housing comprising sidewalls and a top wall defining an interior space;
a lid;
a plurality of internal contact elements which are arranged at least partially in said interior space;
a first coupling comprising a first contact element; and
a second coupling comprising a second contact element;
wherein one of said internal contact elements is in an electrical contact with said first contact element and one of said internal contact elements is in an electrical contact with said second contact element,
wherein one of said contact elements penetrate at least one of the sidewalls, so that said contact element that penetrates the sidewall provides an electrical contact from external contact elements to said internal contact elements;
wherein said top wall comprises an opening extending only partially in said top wall, such that access to said internal contact elements in a substantially perpendicular direction to the surface of a solar panel for connecting the internal contact elements to the solar panel is provided, and
wherein the top wall comprises an outer sidewall that extends substantially perpendicular from the top wall and that surrounds substantially the outer circumference of the top wall, so that an overflow space is defined by the top wall and the outer sidewall.

2. Junction box according to claim 1, wherein the opening is substantially surrounded by an inner sidewall which extends substantially perpendicular from said top wall.

3. Junction box according to claim 1, wherein a filling material is injectable into the interior space through said opening, so that the interior space is fully filled with said filling material, and wherein the opening is closeable with the lid.

4. Junction box according to claim 1, wherein the lid comprises a wall extending substantially perpendicular to the lid and having a shape that fits into or around the opening in the top surface.

5. Junction box according to claim 1, wherein the lid comprises further embossments that are arranged such that they extend through the opening into the interior space when being mounted onto the housing, wherein due to said further embossments filling material is forced to flow through the opening into the overflow space, when said lid is mounted onto the housing filled with the filling material.

6. Junction box according to claim 1, wherein the first coupling and the second coupling are connected to sidewalls, wherein the sidewalls comprise holes in order to allow the contact element to extend into the interior space.

7. Junction box according to claim 6, wherein the first coupling extends along a first axis and the second coupling extends along a second axis, wherein a first external contact element is introducible into the first coupling along the first axis and a second external contact element is introducible into the second coupling along the second axis and wherein the first axis and the second axis are arranged such that they are angular with an angle α that is between 5° and 170° in a common plane.

8. Junction box according to claim 7, wherein in particular between 75° and 125°.

9. Junction box according to claim 8, wherein the common plane is parallel to a flange surrounding a bottom opening in the housing.

10. Junction box according to claim 1, wherein parts of the internal contact elements extend from the interior space through a bottom opening in the housing over the surface of the housing.

11. Junction box according to claim 1, wherein the internal contact elements comprise a resilient section, so that the parts of the internal contact elements that extend over a bottom opening in the housing are moveable with respect to the bottom opening.

12. Junction box according to claim 1, wherein the contact element of the first coupling is connected with a diode to the contact element of the second coupling, wherein the diode is arranged such that the diode is covered by parts of the top wall.

13. Method for manufacturing a junction box according to claim 1, wherein the method comprises the steps of
providing the first coupling with a first contact element and the second coupling with a second contact element;
connecting the first coupling and the second coupling with the housing;
providing each of the internal contact elements with a solder tail;
affixing the diode at the first contact element and at the second contact element.

14. Method for providing a solar panel with a junction box according to claim 1, wherein the method comprises the steps of:
applying adhesive to the junction box base perimeter or flange;
arranging the junction box on a surface of a solar panel module;
affixing solder tail to contacts of a solar panel in a perpendicular direction;
filling at least a portion of an interior space of the housing with a filling material; and
mounting the lid on the top wall, so that parts of the lid, extend into the interior space of the housing.

15. Photovoltaic solar panel comprising at least a carrier layer and a solar cell that is arranged on the front side of said carrier layer, wherein a junction box according to claim 1, is arranged on the back side of said carrier layer.

16. Photovoltaic solar panel according to claim 15, wherein a bottom opening in the housing of the junction box faces the back side of said carrier layer and wherein the carrier layer comprises openings through which the solder elements are passed through to the solar cell.

17. Junction box according to claim 1, comprising a solder element for providing an electrical connection between a first electrical device and a second electrical device, wherein the solder element comprises a cylindrically shaped contact zone to be contacted to the first electrical device, a resilient zone and a cylindrically shaped transfer zone having a solder zone to be contacted to the second electrical device, wherein the axes of the contact zone and of the transfer zone are axially arranged in alignment of a longitudinal axis and wherein the resilient zone enables adjustment of the axial distance between the contact zone and the solder zone.

18. Junction box according to claim 17, wherein the resilient zone is arranged between the contact zone and the solder zone.

19. Junction box according to claim 17, wherein the resilient zone is designed as a bending structure, wherein bending of said bending structure results in said adjustment.

20. Junction box according to claim 17, wherein the resilient section comprises at least one resilient web.

21. Method for producing a junction box according claim 17, wherein the solder element is produced by a stamping or forming process.

22. Junction box according to claim 1, wherein said lid is arranged to cover at least said opening.

* * * * *